United States Patent

Lee et al.

[11] Patent Number: 5,959,321
[45] Date of Patent: Sep. 28, 1999

[54] DRAM MATRIX OF BASIC ORGANIZATIONAL UNITS EACH WITH PAIR OF CAPACITORS WITH HEXAGON SHAPED PLANAR PORTION

[75] Inventors: Chang Jae Lee; Won Suck Yang; Kong Hee Park, all of Chungcheongbuk-do, Rep. of Korea

[73] Assignee: LG Semicon, Ltd.

[21] Appl. No.: 08/901,876

[22] Filed: Jul. 29, 1997

[30] Foreign Application Priority Data

Jul. 31, 1996 [KR] Rep. of Korea ............... 96-31664

[51] Int. Cl.⁶ .................. H01L 27/108; H01L 29/76; H01L 29/94; H01L 31/119
[52] U.S. Cl. ..................... 257/296; 257/303; 257/306
[58] Field of Search .................... 257/296, 303, 257/306, 302; 438/239

[56] References Cited

U.S. PATENT DOCUMENTS

| | | | |
|---|---|---|---|
| 4,651,183 | 3/1987 | Lange et al. | 257/911 |
| 4,959,698 | 9/1990 | Shinichi | 257/302 |
| 5,014,103 | 5/1991 | Ema | 357/41 |
| 5,140,389 | 8/1992 | Kimura et al. | 357/23.6 |
| 5,194,752 | 3/1993 | Kumagai et al. | 257/390 |
| 5,686,746 | 11/1997 | Iwasa | 257/296 |
| 5,691,551 | 11/1997 | Eimori | 257/306 |
| 5,770,874 | 6/1998 | Egawa | 257/296 |

*Primary Examiner*—Olik Chaudhuri
*Assistant Examiner*—Phat X. Cao

[57] ABSTRACT

A dynamic random access memory (DRAM) organized as a matrix of basic organizational units each having a capacitor pair. Each capacitor pair has one of the first capacitors and one of the second capacitors in it. Each basic organizational unit is arranged as follows: a first word line and a second word line are formed, as parallel lines, on the substrate; the first word line lies between a first doped region and a second doped region to define a first transistor; the second word line lies between the second doped region of the first transistor and a third doped regions to define a second transistor; a bit line lies on the second doped region of the substrate at an oblique angle to the first word line and second word line; the first capacitor overlies the first doped region and the first word line, is substantially centered over the first doped region, is connected to the first doped region via a first contact hole, and has a hexagon-shaped planar portion; the second capacitor overlies the third doped region and the second word line, is substantially centered over the third doped region, is connected to the third doped region via a second contact hole, and has a hexagon-shaped planar portion; and a center point of each of the first doped region, second doped region and third doped region of the basic organizational unit are connectable by an imaginary straight characteristic line.

36 Claims, 5 Drawing Sheets

DRAM MATRIX OF BASIC ORGANIZATIONAL UNITS EACH WITH PAIR OF CAPACITORS WITH HEXAGON SHAPED PLANAR PORTION

BACKGROUND OF THE INVENTION

The present invention relates to a DRAM (Dynamic Random Access Memory), and more particularly, to a cell array of the DRAM.

Generally, with the integration of a semiconductor DRAM device, layouts and structures of cell arrays suitable for high integration thereof have been proposed.

A capacitor under bit line (CUB) structure applies to 16 Mb DRAM sizes or smaller, while a capacitor over bit line (COB) structure applies to 64 Mb DRAM sizes or greater.

FIGS. 1a and 1b depict a layout and a sectional view, respectively, showing a cell array of a conventional CUB structure.

As shown in FIGS. 1a and 1b, the CUB structure includes gate lines 2 arranged in rows on a substrate 1, gate insulator layers 2a, a node electrode 3 over and between the gate lines 2 and in contact with the substrate 1, a plate electrode 4 on the node electrode 3 (a capacitor dielectric between the plate electrode 4 and the node electrode 3 is not shown), an insulator layer 5a on the plate electrode 4, the gate insulator 2a, and the substrate 1, and a bit line 5 over and perpendicular to the gate lines 2. The active region is denoted by X.

That is, the CUB structure includes the bit line 5 formed on a capacitor having the node electrode 3 and the plate electrode 4.

In the CUB structure as aforementioned, in order to obtain a capacitor having a sufficient capacitance required for highly integrated DRAMs, the height of the capacitor must be high. However, this causes a problem in that an aspect ratio of a contact hole 6 of the bit line gets higher. This, in turn, causes difficulties in the technology relating to forming a conductive layer into of the contact hole 6 and patterning the bit line 5.

For this reason, a new layout for the cell array has been required for 64M DRAMs.

FIGS. 2a and 2b show a layout and a sectional view, respectively, showing a cell array of a conventional COB structure.

As shown in FIGS. 2a and 2b, the COB structure includes gate lines 11 arranged in a row on a substrate 10, a bit line 12 perpendicular to the gate lines 11 and in contact with the gate insulating layers 11a and the substrate 10, a node electrode 13 in a rectangular form over and between the gate lines 11 and in contact with the substrate 10 and the gate insulating layers 11a, and a plate electrode 14 over the node electrode 13. A dielectric layer 15 is formed between the plate electrode 14 and the node electrode 13.

In the COB structure as aforementioned, since the bit line 12 is formed sooner than the capacitor, the capacitor region may include the bit line 12. As a result, the aspect ratio of the bit line contact hole 16 does not increase even if the height of the capacitor becomes high for high capacitance.

The cell array of the COB structure allows the effective area of the bit line to be incorporated into the capacitor region. It also allows the effective area of the capacitor to increase by increasing the height of the capacitor so that it can be used in a 64M DRAM or a 256M DRAM.

However, the cell array of the COB structure has several problems.

First, it is hard to mass produce DRAM devices using a technology which increases the effective area of the capacitor, because this goes against the prevailing trend of reducing the effective area of the cell in order to achieve a 1G DRAM size or greater.

Second, shrinkage of the node electrode of the capacitor due to the use of a rectangular-shape pattern makes the electrode region of the capacitor smaller than its actual design.

Third, a narrow interval between the bit lines makes parasitic capacitance of the bit lines higher.

Thus, high capacitance of the cell capacitor is required to maintain the capacitance $C_S$ of the cell capacitor and the parasitic capacitance $C_B$ of the bit line, which have certain levels required for the design of the memory cell. However, it is not suitable for highly integrated devices.

SUMMARY OF THE INVENTION

Accordingly, the present invention is directed to a DRAM device having a high dielectric ratio and high reliability that substantially obviates one or more of the problems due to limitations and disadvantages of the related art.

An object of the present invention is to provide a DRAM device which has improved speed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the DRAM according to the present invention includes: a semiconductor substrate; an active region in the substrate including a first region having a first impurity region, a second region having a third impurity region, and a bent region between the first impurity region and the second impurity region, the bent region having a second impurity region; a first word line provided over and between the first impurity region and the second impurity region; a second word line provided over and between the second impurity region and the third impurity region; insulating layers on the substrate and on the word lines, having a first contact hole on the first impurity region, a second contact hole on the second impurity region, and a third contact hole on the third impurity region, respectively; a bit line electrically connected to the second impurity region through the second contact hole, extending across the word lines at the bent region; a first capacitor with a hexagon-shaped planar portion above the first region, electrically connected to the first impurity region through the first contact hole; and a second capacitor with a hexagon-shaped planar portion above the second region, electrically connected to the third impurity region through the third contact hole, wherein one side of the hexagon-shaped planar portion of the second capacitor is parallel to one side of the hexagon-shaped planar portion of the first capacitor, and the second contact hole is disposed between the first and second capacitors.

The objects of the present invention are also achieved by providing a method of forming a cell array of a DRAM which includes the steps of: arranging the contact holes such that a respective first contact hole, second contact hole, and third contact hole are connectable by an imaginary straight line; arranging the first word line between the first contact hole and the second contact hole; arranging the second word line between the second contact hole and the third contact hole so as to be symmetric with the first word line relative to the central point of the second contact hole; disposing the central point of the second contact hole to be on the central line of the bit line; arranging the bit line to be a straight line forming an angle $\theta_{21}$ of $0°<\theta_{21}<90°$ counterclockwise and an angle $\theta_{22}$ of $90°<\theta_{22}<180°$ clockwise against the respective center lines of the first and second word lines; and arranging the first and second capacitors such that the respective central points of the first and third contact holes are aligned with the central points of the first and second capacitors, respectively.

These and other objects of the present invention are also achieved by providing a method of forming a dynamic random access memory (DRAM), the DRAM including a plurality of bit lines and a plurality of capacitor pairs, the method comprising the steps of: forming a plurality of hexagon-shaped node electrodes into a first matrix over a substrate; forming a dielectric on said hexagon-shaped node electrodes; selectively forming plate electrodes to define said plurality of capacitor pairs; and selectively connecting said plurality of bit lines to said plate electrodes. The method further includes the steps of: forming a layer of electrode material over said substrate; and patterning said layer using a mask having a plurality of hexagonal apertures so as to form said plurality of hexagon-shaped node electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together will the description serve to explain the principles of the drawings:

In the drawings:

FIG. 3b is a sectional view taken along line III-III' of FIG. 3a;

DETAILED DESCRIPTION OF THE PREFERRED EMBODIMENTS

Reference will now be made in detail to the preferred embodiments of the present invention, examples of which are illustrated in the accompanying drawings.

Figure 1A:
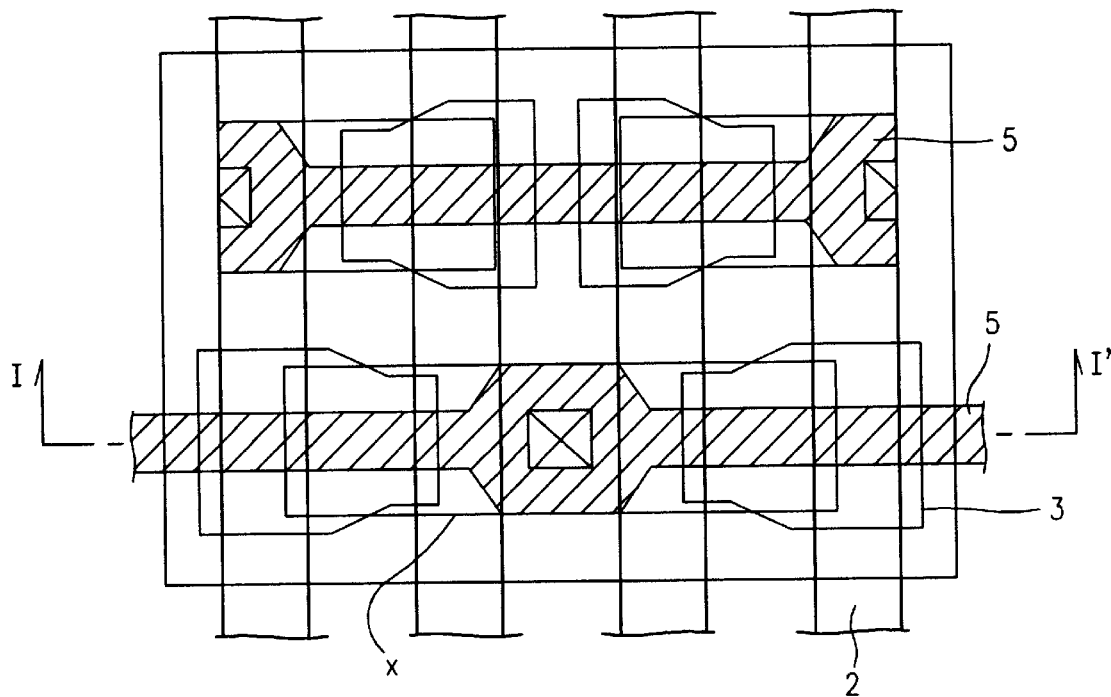
FIGS. 1a and 1b provide a plane view and a sectional view, respectively, showing a cell array of a conventional CUB structure.
Figure 1B:
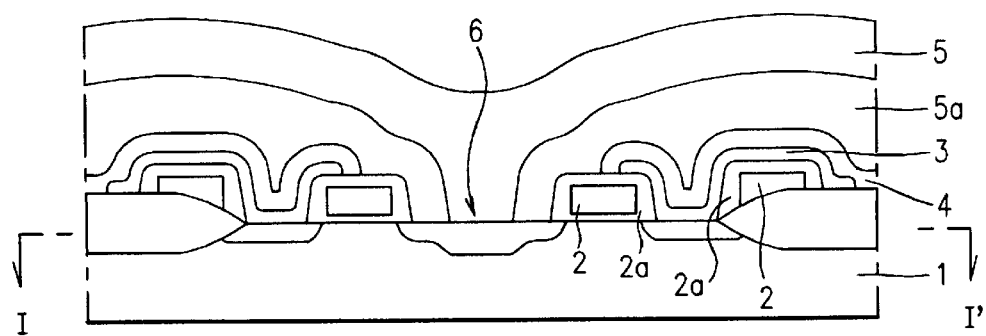
Figure 2A:
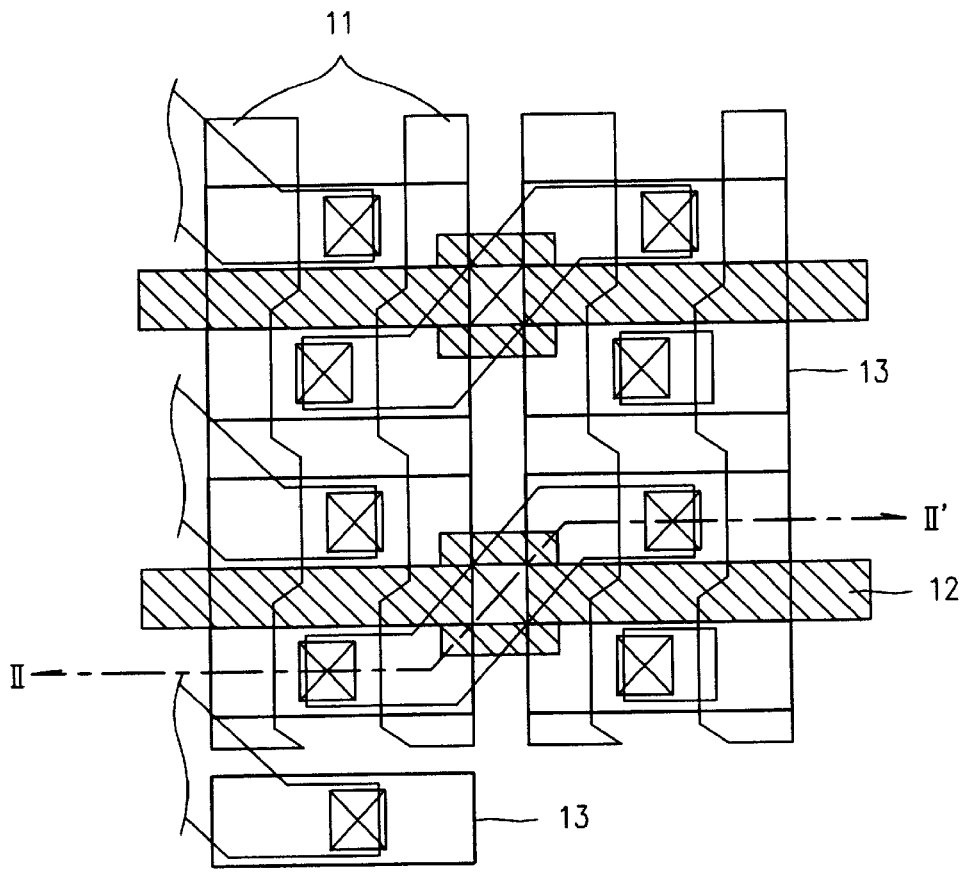
FIGS. 2a and 2b provide a plane view and a sectional view, respectively, showing a cell array of a conventional COB structure.
Figure 2B:
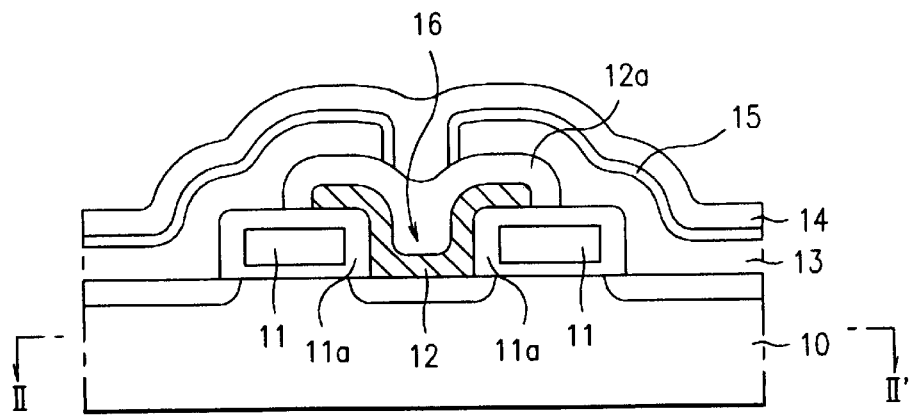
Figure 3A:
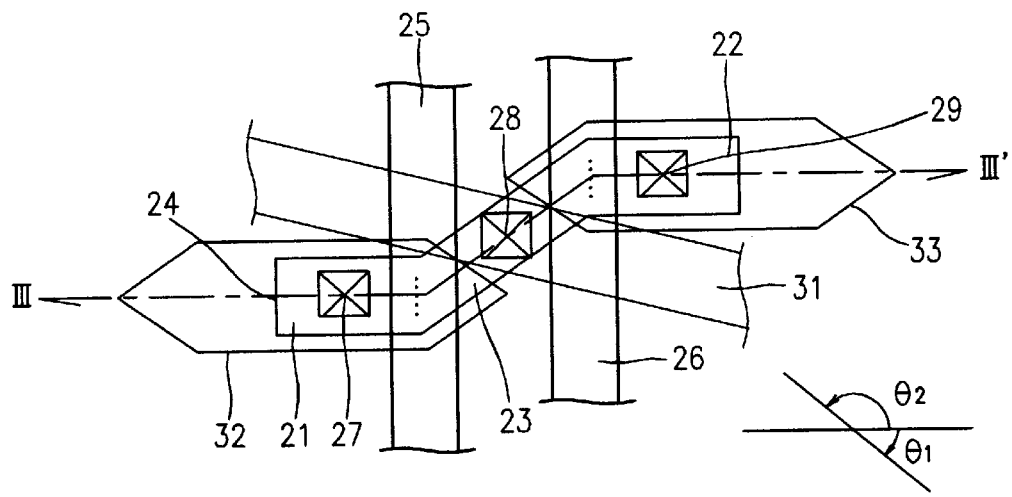
FIG. 3a is a plane view showing an array of components of a DRAM according to the present invention.
Figure 3B:
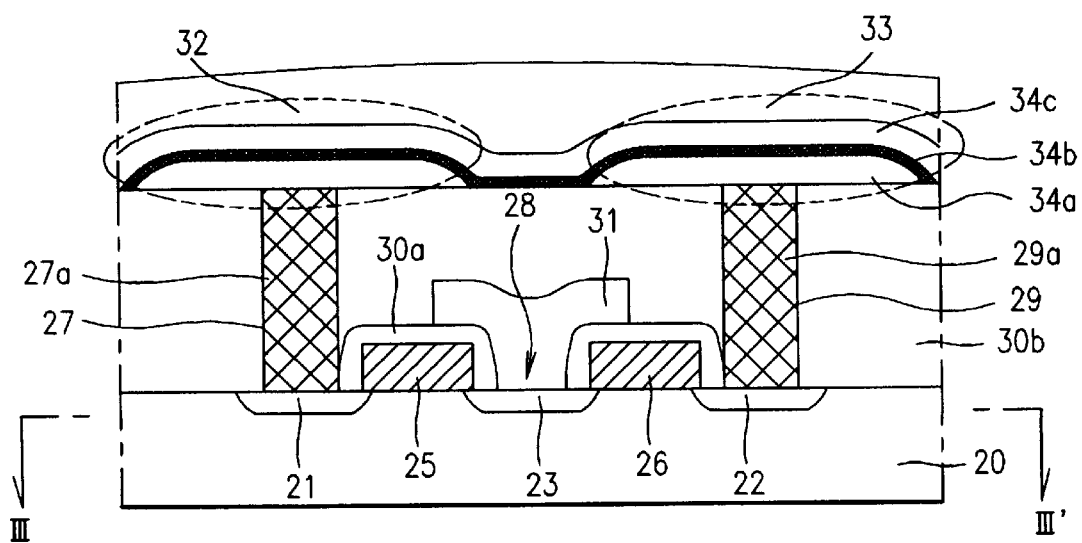

FIG. 3a is a plane view showing an array of components of a DRAM according to the present invention. FIG. 3b is a sectional view taken along the line III-III' of FIG. 3a.

As shown in FIGS. 3a and 3b, the DRAM according to the present invention comprises a semiconductor substrate 20, an active region 24, a first word line 25, a second word line 26, insulating layers 30a and 30b, a bit line 31, a first capacitor 32, and a second capacitor 33. The active region 24 includes a first (category) region 21 having a first impurity region, a second (category) region 22 having a third impurity region, and a bent region 23 between the first region 21 and the second region 22, having a second impurity region. The first word line 25 is formed on the substrate 20 and slightly over, but mostly between, the first impurity region and the second impurity region. The second word line 26 is formed on the substrate 20 and slightly over, but mostly between, the second impurity region and the third impurity region.

The insulating layer 30a, provided on the substrate 20 and the word lines 25 and 26, has a contact hole 28 on the second impurity region. The insulating 30b, provided on the substrate 20, the bit line 31, and the insulating layer 30a, has a first contact hole 27 on the first impurity region and a third contact hole 29 on the third impurity region. The bit line 31 is electrically connected to the second impurity region through the second contact hole 28 and extends partially over the word lines 25 and 26.

The first capacitor 32 is electrically connected to the first impurity region by conductive material 27a in the first contact hole 27 and has a hexagon-shaped planar portion centered substantially over the first region 21. The second capacitor 33 is electrically connected to the third impurity region by conductive material 29a in the third contact hole 29 and has a hexagon-shaped planar portion centered substantially over the third region 22. One side of the hexagon-shaped planar portion of the capacitor 33 parallels one side of the hexagon-shaped planar portion of the first capacitor 32. The second contact hole 28 is disposed between the first and second capacitors 32 and 33. The hexagon-planar portions are best seen in FIG. 3a.

The center of the bit line 31 is formed over the bent region 23 and intersects the central point of the second contact hole 28.

The bent region 23 of the active region 24 is preferably bent, or formed at an angle between and relative to, the central line of the first word line 25 and the central line of the second word line 26. The bent region 23 is preferably neither parallel to nor at right angles with the central lines of the word lines 25 and 26, i.e., the bit line 31 forms an oblique angle with the word lines 25 and 26, respectively.

The one side of the hexagonal planar portion shape of the first capacitor 32 and the one side of the hexagonal planar portion of the second capacitor 33 are disposed equidistantly from respective sides of the contact hole 28 or from the center of the contact hole 28.

Figure 4:
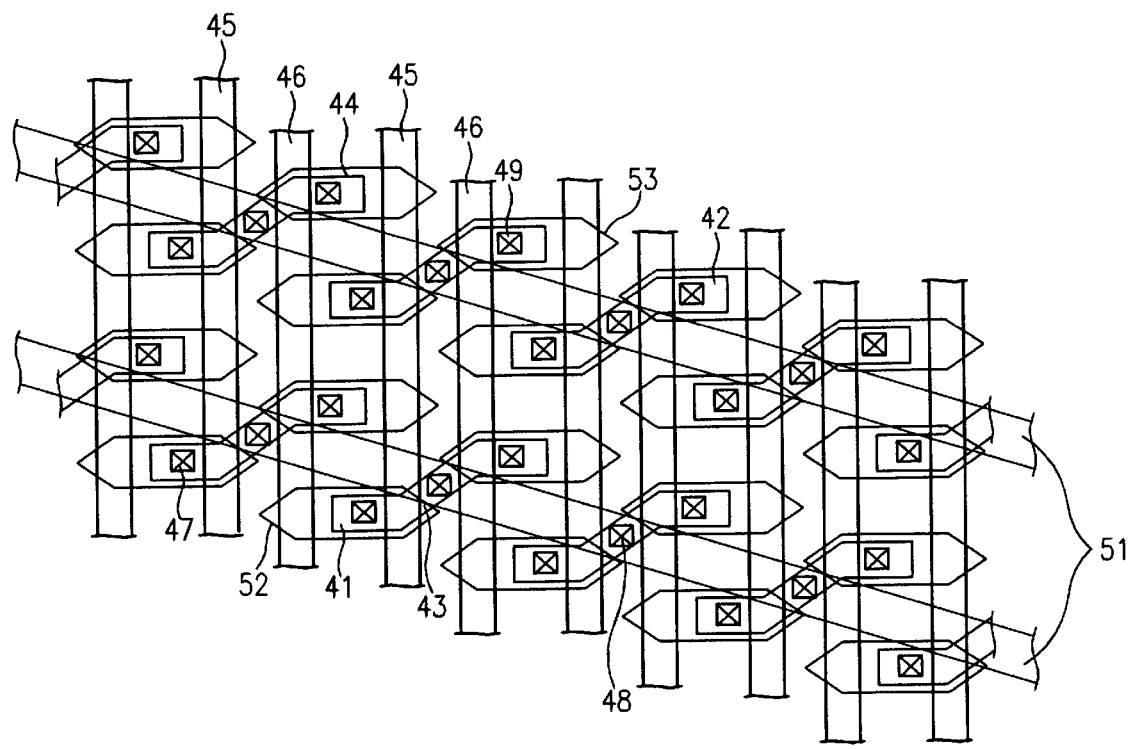
FIG. 4 is a plane view showing a cell array of a DRAM according to the present invention.

An imaginary straight characteristic line connects the central point of the first contact hole 27, the central point of the second contact hole 28, and the central point of the third contact hole 29. Such imaginary characteristic lines are preferably parallel. Similarly, the bit lines e.g., 31 of FIG. 3a or 51 of FIG. 4, are preferably parallel.

The planar portions of the first and second regions 21 and 22 in the active region 24 preferably have rectangular shapes, respectively.

The central line of the bit line 31 defining the bent region 23 in the active region 24 is not parallel to the imaginary line connecting the central points of the contact holes 27, 28 and 29, rather it is oblique.

The first contact hole 27 and the third contact hole 29 are preferably aligned with the respective center lines of the hexagonal planes of the first and second capacitors 32 and 33. The center of the second contact hole 28 is preferably aligned with the center of the bent region 23.

Further, the first region 21 of the active region 24 crosses the first word line 25 preferably at a right angle. The bent region 23 extends at an acute angle or right angle from the end of the first region 21 thereby forming an obtuse or right angle with the first region 21. The second region 22 extends at an acute angle or right angle from the end of the bent region 23 thereby forming an obtuse or right angle with the bent region 23. The second region 22 preferably crosses the second word line 26 at a right angle.

The first word line 25 and the second word line 26 are preferably symmetrical with respect to the second contact hole 28.

The central line of the bit line 31 forms an angle $\theta_1$ of $0° < \theta_1 < 90°$ counterclockwise and an angle $\theta_2$ of $90° < \theta_2 < 180°$ clockwise against the respective central lines of the first word line 25 and the second word line 26.

The first impurity region at the first region 21, the second impurity region at the bent region 23, and the first word line 25 provide a first transistor. The second impurity region at bent region 23, the third impurity region at the third region 22, and the second word line 26 provide a second transistor.

The first, second and third contact holes 27, 28 and 29 preferably have substantially circular shapes in cross section. The word lines 25 and 26 and a portion of the bit line 31 lie at the same level. The first contact hole 27 and the third contact hole 29 are preferably disposed at the same distance from the corresponding bit line 31.

The node electrode 34a and the plate electrode 34c of the capacitors 32 and 33 include any one of metal materials having high insulating resistance when oxidized. For example, the metal materials may be Pt, $RuO_2$, $IrO_2$, and the like. A high dielectric layer 34b of the capacitors 32 and 33 preferably has a single grain.

The node electrode 34a and the high dielectric layer 34b of the capacitors 32 and 33 interact. Their component materials are selected by considering crystal orientation of the dielectric material. The high. dielectric layers preferably include any one of $Ta_2O_5$, $SrTiO_3$, $BaTiO_3$, $PbZrO_3$, BST $((Ba,Sr)TiO_3)$, PZT$(Pb(Zr,Ti)O_3)$ PLZT $((Pb,La)(Zr,Ti)O_3)$, or PNZT$((Pb,Nb)(Zr,Ti)O_3)$.

FIG. 4 is a plane view showing a cell array of a DRAM according to the present invention.

As shown in FIG. 4, the DRAM comprises a. semiconductor substrate (not labelled), a plurality of first word lines 45, a plurality of second word lines 46, an insulating layer (not labelled), a plurality of bit lines 51, a plurality of first capacitors 52, and a plurality of second capacitors 53. The semiconductor substrate has an active region 44 which includes a first region 41 having a first impurity region, a second region 42 having a third impurity region, and a bent region 43 disposed between the first region 41 and the second region 42 and having a second impurity region.

In FIG. 4, a plurality of the first word lines 45 are formed between respective first impurity regions and second impurity regions. A plurality of the second word lines 46 are formed between respective second impurity regions and third impurity regions. The insulating layer formed on the substrate and on the word lines 45 and 46 has a plurality of first contact holes 47 on the first impurity region, a plurality of second contact holes 48 on the second impurity region, and a plurality of third contact holes 49 on the third impurity region. A plurality of the bit lines 51 are electrically connected to the second impurity regions through corresponding second contact holes 48, and cross the respective first and second word lines 45 and 46 and the bent region 43 of the active region 44.

Also in FIG. 4, a plurality of the first capacitors 52 are electrically connected to the first impurity regions through corresponding first contact holes 47, and preferably have hexagonal planar portions substantially centered above the first regions 41. A plurality of the second capacitors 53 are electrically connected to the third impurity regions through corresponding third contact holes 49, and preferably have hexagonal planar portions substantially centered above the second regions 42. One side of the hexagonal shape of the planar portions of the second capacitors 53 is parallel to one side of the hexagonal shape of the planar portions of the first capacitors 52. The second contact holes 48 are disposed between the first and second capacitors 52 and 53.

The respective bit lines 51 connect to the central points of the second contact holes 48 to obliquely cross the word lines 45 and 46.

The first contact holes 47 and the third contact holes 49 adjacent to the respective bit lines 51 are preferably disposed at the same distance from the bit lines 51.

The central lines of the bit lines 51 are arranged above the bent regions 43 and intersect the central points of the second contact holes 48.

The bent region 43 of the respective active regions 44 is bent between the central line of the first word line 45 and the central line of the second word line 46.

The one side of the hexagonal shape of the first capacitors 52 and the one side of the hexagonal shape of the second capacitors 53 are disposed equidistant from the sides of the corresponding second contact hole 48. Imaginary straight lines connect the central points of the first contact holes 47, the second contact holes 48, and the third contact holes 49. These imaginary lines are parallel to each other and are oblique to the central lines of the bent regions 43, and cross the bent regions 43 at the central points of the corresponding second contact holes 48. The respective planar portions of the first region 41 and the second region 42 preferably have rectangular shapes.

The first contact holes 47 and the third contact holes 49 are preferably aligned with the respective centers of the hexagonal shapes of the first and second capacitors 52 and 53. The centers of the second contact holes 48 are preferably aligned with respective centers of the bent regions 43.

The first regions 41 of the active region 44 cross the first word lines 45, preferably at right angles. The bent region 43 extends at an angle between an oblique angle and a right angle from the end of the first region 41. The second region 42 extends at an acute angle or a right angle from the end of the bent region 43; crosses the second word lines 46 at right angles.

The first word lines 45 and the second word lines 46 are symmetrically disposed with respect to a corresponding second contact hole 48.

The central lines of the bit lines 51 form an angle $\theta_{11}$ of $0° < \theta_{11} < 90°$ counterclockwise and an angle $\theta_{12}$ of $90° < \theta_{12} < 180°$ clockwise against the respective central lines of the first word line 45 and the second word line 46.

The first impurity region at the first region 41, the second impurity region at the bent region 43, and the first word line 45 provide a first transistor. The second impurity region at the bent region 43, the third impurity region at the second region 42, and the second word line 46 provide a second transistor.

The first, second and third contact holes 47, 48 and 49 preferably have substantially circular shapes in cross-section. The word lines 45 and 46 and a portion of the bit lines 51 lie in the same level. The first contact hole 47 and the third contact hole 49 are preferably disposed at the same distance from the corresponding bit line 51.

The node electrode and the plate electrode of the capacitors 52 and 53 include any one of metal materials having high insulating resistance when oxidized. For example, the metal materials may be Pt, $RuO_2$, $IrO_2$, and the like.

High dielectric layers (not labelled) of the capacitors 52 and 53 preferably have a single grain, respectively. The node electrode (not labelled) and the high dielectric layers of the capacitors 52 and 53 interact. Their component materials are selected by considering crystal orientation of the dielectric material. The high dielectric layers preferably include any one of $Ta_2O_5$, $SrTiO_3$, $BaTiO_3$, $PbZrO_3$, BST, PZT, PLZT, or PNZT.

As aforementioned, the reason why the node electrode of the capacitor has a hexagonal shape will be described with reference to FIGS. 5a and 5b.

Figure 5A:
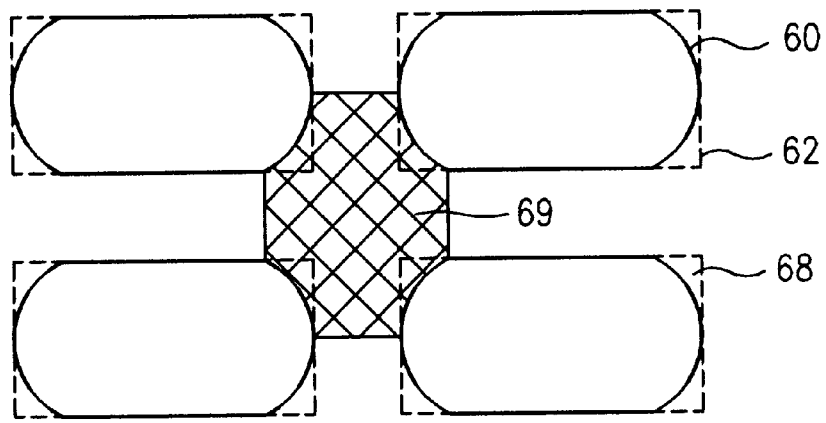
FIGS. 5a and 5b compare conventional and inventive plane views, respectively, to show how a capacitor's node electrode is distorted in shape relative to the pattern used to form it.

FIG. 5a is a plane view contrasting the rectangular pattern (used in the conventional process of patterning to form a conventional node electrode) and the resulting conventional node electrode shape.

As shown in FIG. 5a, a conventional art cell has a node electrode 60 suitable for its array, which enhances an electrode region.

However, the node electrode 60 makes the capacitor region smaller due to heavy shrinkage at an edge of the rectangle-shaped pattern 62 by dispersion of light during the photolithographic patterning process. Thus, the cell structure having a conventional node electrode 60 formed from a conventional rectangular-shape pattern 62 causes a reduction in the effective area of the capacitor. That is, a dead space 68 unused by the capacitor region increases, which increases the unusable interior region 69 where four rectangular-shape pattern edges join at one place.

Figure 5B:
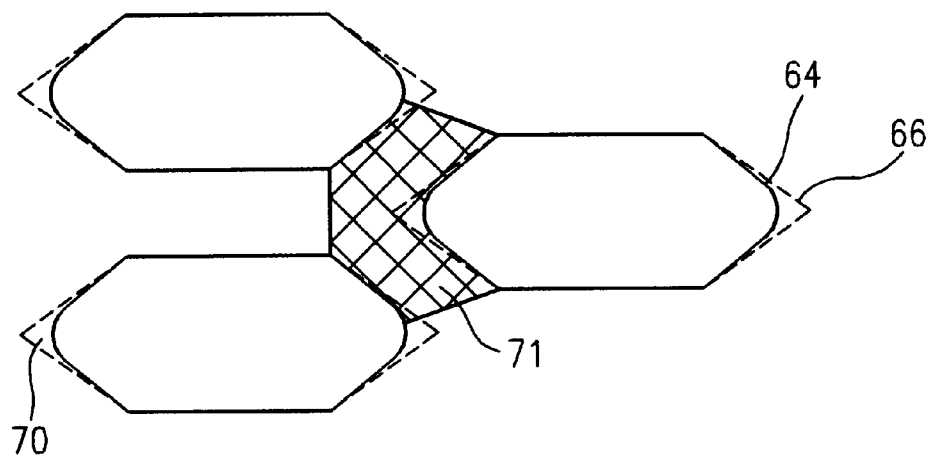

Meanwhile, as shown in FIG. 5b, a cell structure according to the present invention having a hexagon-shaped node electrode 64 formed from a hexagonal pattern 66 enhances the area of the capacitor since three hexagonal pattern edges join at one place. The dead space 70 is smaller as compared to the dead space 68 of the conventional art node electrodes of FIG. 5a, so that the unusable interior region 71 is smaller than region 69.

The DRAM according to the present invention has the following effects.

First, a cell according to the present invention can be operated with a significantly lower capacitance $C_S$ of the cell capacitor and a significantly lower parasitic capacitance $C_B$ of the bit line.

Second, since the parasitic capacitance of the bit line of a cell according to the present invention is small, the speed as well as the reliability of the cell operation is improved.

Third, a cell according to the present invention has an interval between the bit lines that is great enough to significantly reduce the parasitic capacitance there between.

Fourth, the hexagon-shaped node electrode i.e., the node electrode formed from a hexagonal-shaped pattern, makes the pattern shrinkage smaller so as to enhance the area of the capacitor thereby decreasing dead space between capacitors.

Fifth, it is likely that high dielectric layers of the respective capacitors of the present invention will be formed with a single grain due to the crystal boundary having three central points based on the hexagonal-shaped node electrode.

Finally, since the capacitor includes a high dielectric layer having a single grain, the dielectric ratio is high and leakage current is low.

It will be apparent to those skilled in the art that various modifications and variations can be made in the DRAM of the present invention without departing from the spirit or scope of the invention. Thus, it is intended that the present invention cover the modifications and variations of the invention provided they come within the scope of the appended claims and their equivalents.

What is claimed is:

1. A DRAM comprising:

a semiconductor substrate;

an active region in the substrate, the active region including a first category region having a first impurity region, a second category region having a third impurity region, and a bent region between the first region and the second region, the bent region having a second impurity region;

a first word line provided on the substrate lying between the first impurity region and the second impurity region;

a second word line on the substrate lying between the second impurity region and the third impurity region;

a first insulating layer, on the substrate and on the word lines, having a second contact hole through to the second impurity region;

a bit line electrically connected to the second impurity region through the second contact hole, extending obliquely across the word lines at the bent region;

a second insulating layer, on the substrate, the first insulating layer, and the bit line, having a first contact hole through to the first impurity region and a third contact hole through to the third impurity region;

a first capacitor, on the second insulating layer, with a hexagon-shaped planar portion above the first region, electrically connected to the first impurity region through the first contact hole; and a second capacitor, on the second insulating layer, with a hexagon-shaped planar portion above the second region, electrically connected to the third impurity region through the third contact hole, wherein one side of the hexagon-shaped planar portion of the second capacitor is parallel to one side of the hexagon-shaped planar portion of the first capacitor, and the second contact hole is disposed between the first and second capacitors;

at least on one of (A) said bit line and (B) both of said first and second word lines being straight.

2. The DRAM according to claim 1, wherein the one side of the hexagon-shaped planar portion of the first capacitor and the one side of the hexagon-shaped planar portion of the second capacitor are equidistant from the second contact hole.

3. The DRAM according to claim 1, wherein the central points of the first, second, and third contact holes are connectable by an imaginary straight line.

4. The DRAM according to claim 1, wherein the first category and second category regions have generally rectangular shapes.

5. The DRAM according to claim 1, wherein the first contact hole and the third contact hole are aligned with the respective centers of the hexagon-shaped planar portions of the first and second capacitors, and the center of the second contact hole is aligned with the center of the bent region.

6. The DRAM according to claim 1, wherein the first region of the active region crosses the first word line at a right angle, the bent region extends from and is non-colinear with the end of the first category region, and the second category region extends from and is non-colinear with the end of the bent region and crosses the second word line at a right angle.

7. The DRAM according to claim 1, wherein the first word line and the second word line are symmetrical with respect to the second contact hole.

8. The DRAM according to claim 1, wherein the first impurity region, the second impurity region, and the first word line provide a first transistor, while the second impurity region, the third impurity region, and the second word line provide a second transistor.

9. The DRAM according to claim 1, wherein the first contact hole, the second contact hole, and the third contact hole have substantially circular shapes in cross-section.

10. The DRAM according to claim 1, wherein the word lines and a portion of the bit line lie at the same level relative to the semiconductor substrate.

11. The DRAM according to claim 1, wherein the first contact hole and the third contact hole are disposed at the same distance from the corresponding bit lines.

12. The DRAM according to claim 1, wherein said bit line and said first and second word line are straight lines.

13. The DRAM of claim 1, wherein said hexagon-shaped planar portions are symmetric.

14. A DRAM comprising:

a semiconductor substrate having a plurality of active regions, each active region including a first category region having a first impurity region, a second category region having a third impurity region, and a bent region between the first region and the second region, the bent region having a second impurity region;

a plurality of first word lines on the substrate lying between respective first impurity regions and second impurity regions;

a plurality of second work lines on the substrate lying between respective second impurity regions and third impurity regions;

a first insulating layer, on the substrate and on the word lines, having a plurality of second contact holes through to the respective second impurity regions;

a plurality of bit lines electrically connected to certain ones of the second impurity regions through corresponding second contact holes, the bit lines obliquely crossing the word lines at the bent region;

a second insulating layer, on the substrate, the first insulating layer and the bit line, having a plurality of first contact holes through to the respective first impurity regions and a plurality of third contact holes through to the respective third impurity regions;

a plurality of first capacitors, on the second insulating layer, electrically connected to respective ones of the first impurity regions through corresponding first contact holes, each of the first capacitors having a hexagon-shaped planar portion above on the first region; and a plurality of second capacitors, on the second insulating layer, electrically connected to respective ones of the third impurity regions through corresponding third contact holes, each of the second capacitors having a hexagon-shaped planar portion above the second region, wherein each of the second capacitors has one side of the hexagon-shaped planar portion lying parallel to one side of the hexagon-shaped planar portion of a corresponding first capacitor, and a corresponding one of the second contact holes is disposed between said corresponding parallel sides;

at least one of (A) said plurality of bit lines and (B) both of said pluralities of first and second word lines being straight lines.

15. The DRAM according to claim 14, wherein the first contact holes and the third contact holes are adjacent to the respective bit lines and disposed at the same distance away from the bit lines.

16. The DRAM according to claim 14, the corresponding parallel sides of the hexagon-shaped planar portions of the first capacitor and the second capacitor are disposed equidistant from a corresponding second contact hole.

17. The DRAM according to claim 14, wherein the central point of the first contact hole, the central point of the second contact hole, and the central point of the third contact hole are connectable by an imaginary straight line.

18. The DRAM according to claim 14, wherein the first regions and the second regions have generally rectangular shapes.

19. The DRAM according to claim 14, wherein the first contact hole and the third contact hole are aligned with the respective centers of the hexagon-shaped planar portions of the first and second capacitors, and the center of the second contact hole is aligned with the center of the bent region.

20. The DRAM according to claim 14, wherein a respective first category region of the active region crosses the first word line at a right angle, a respective bent region extends from and is non-collinear with the end of the first region, and a respective second category region extends from and is non-colinear with the end of the bent region and crosses the second word line at a right angle.

21. The DRAM according to claim 14, wherein the first word line and the second word line are symmetrical with respect to a respective second contact hole.

22. The DRAM according to claim 14, wherein the first impurity region, the second impurity region, and the first word line provide a first transistor, while the second impurity region, the third impurity region, and the second word line provide a second transistor.

23. The DRAM according to claim 14, wherein the first contact holes, the second contact holes, and the third contact holes are substantially circular shapes in cross-section.

24. The DRAM according to claim 14, wherein the word line and a portion of the bit line lies at the same level relative to the semiconductor substrate.

25. The DRAM according to claim 14, wherein the first contact holes and the third contact holes are disposed at the same distance from the corresponding bit lines.

26. The DRAM according to claim 14, wherein said plurality of bit lines, said plurality of first word lines and said second plurality of word lines are straight lines.

27. The DRAM of claim 14, wherein said hexagon-shaped planar portions are symmetric.

28. a substrate having a plurality of first doped regions, a plurality of second doped regions, and a plurality of third doped regions;

a plurality of first word lines;
a plurality of second word lines;
a plurality of bit lines;
a plurality of first capacitors; and
a plurality of second capacitors;
at least one of (A) said plurality of bit lines and (B) both of said pluralities of word lines being straight lines;
a plurality of basic organizational units each having a capacitor pair, said plurality of organizational units being organized as a matrix;

each said capacitor pair having one of said first capacitors and one of said second capacitors;

each of said basic organizational units including:

one of said first word lines and one of said second word lines being alternately formed, as parallel lines, on said substrate;

said first word line lying between one of said first doped regions and one of said second doped regions to define a first transistor;

said second word line lying between said second doped region of said first transistor and one of said third doped regions to define a second transistor;

one of said bit lines lying on said second doped region of said substrate at an oblique angle to said first word line and second word line;

the first capacitor of said capacitor pair of said basic organizational unit overlying said first doped region and said first word line, said first capacitor having a hexagon-shaped planar portion, said first capacitor being substantially centered over said first doped region, said first capacitor being connected to said first doped region via a first contact hole; and the second capacitor of said capacitor pair of said basic organizational unit overlying said third doped region and said second word line, said second capacitor having a hexagon-shaped planar portion, said second capacitor being substantially centered over said third doped region, said second capacitor being connected to said third doped region via a second contact hole.

29. The DRAM according to claim 28, wherein each of said basic organizational units further includes:

said first word line lying partially on one of said first doped regions and partially on one of said second doped regions to define a first transistor; and said second word line lying partially the same second doped region as said first word line and partially on one of said third doped regions to define a second transistor.

30. The DRAM according to claim 28, wherein each of said first and second capacitor of said basic organizational unit has a hexagon-shaped planar portion.

31. The DRAM according to claim 28, wherein:

a first side of said hexagon-shaped planar portion of said first capacitor of said basic organizational unit is parallel to a first side of said hexagon-shaped planar portion of said second capacitor of said basic organizational unit; and said first side of said first capacitor said first side of said second capacitor are equidistant from a center point of said second doped region.

32. The DRAM according to claim 28, wherein said first capacitor of said basic organizational unit has a plate electrode and said second capacitor of said basic organizational unit has a plate electrode, said plate electrode of said first capacitor being electrically connected to said plate electrode of said second capacitor.

33. The DRAM according to claim 28, wherein:

a center point of each of said first doped region, second doped region and third doped region of said basic organizational unit are connectable by an imaginary straight characteristic line; and said characteristic lines of each of said basic organizational units being parallel.

34. The DRAM according to claim 28, wherein said bit lines are parallel.

35. The DRAM according to claim 28, wherein said plurality of bit lines, said plurality of first word lines and said plurality of second word lines are straight lines.

36. The DRAM of claim 28, wherein said hexagon-shaped planar portions are symmetric.

* * * * *